United States Patent
Sun

(10) Patent No.: US 7,880,647 B1
(45) Date of Patent: Feb. 1, 2011

(54) HUFFMAN DECODING METHOD

(75) Inventor: Yiyuan Sun, Sunnyvale, CA (US)

(73) Assignees: Silicon Motion Inc., Keji Chuangyeyuan, Tianan Digital, Futian District, Shenzhen, Guangdong (CN); Silicon Motion Inc., Jhubei, Hsinchu County (TW)

( * ) Notice: Subject to any disclaimer, the term of this patent is extended or adjusted under 35 U.S.C. 154(b) by 21 days.

(21) Appl. No.: 12/499,054

(22) Filed: Jul. 7, 2009

(51) Int. Cl.
*H03M 7/40* (2006.01)

(52) U.S. Cl. .................. 341/65; 382/246; 709/220; 375/243

(58) Field of Classification Search ............ 341/65–90; 382/246, 251, 250, 239; 704/201, 219, 500; 707/101; 709/220, 224; 715/205, 236, 239; 375/243, 240.12, 240.22

See application file for complete search history.

(56) References Cited

U.S. PATENT DOCUMENTS

| 6,975,253 B1 * | 12/2005 | Dominic .................... 341/65 |
| 7,076,728 B2 * | 7/2006 | Davis et al. ................ 715/205 |
| 7,739,119 B2 * | 6/2010 | Venkatesha Rao et al. .... 341/65 |

\* cited by examiner

*Primary Examiner*—Lam T Mai
(74) *Attorney, Agent, or Firm*—Winston Hsu; Scott Margo

(57) ABSTRACT

A Huffman decoding method for decoding codewords included in an encoded data transmitted via a stream includes: processing codewords of a codebook that is predefined or extracted from the stream to derive at least an auxiliary lookup table, and storing each derived auxiliary lookup table in a storage device; and searching a decoded value corresponding to a target codeword included in the encoded data according to at least the auxiliary lookup table stored in the storage device and the codebook.

17 Claims, 13 Drawing Sheets

| HV | CL | CW | Sign-bit | First count number | |
|---|---|---|---|---|---|
| 40 | 3 | 000 | ≧0 | 15 | Codeword group 1 |
| 67 | 4 | 0010 | ≧0 | 1 | Codeword group 2 |
| 13 | 5 | 00110 | ≧0 | 1 | |
| 41 | 5 | 00111 | ≧0 | 1 | |
| 37 | 5 | 01000 | ≧0 | 0 | Codeword group 3 |
| 39 | 5 | 01001 | ≧0 | 0 | |
| ⋮ | | | ⋮ | ⋮ | |
| 38 | 6 | 011111 | ≧0 | 0 | |
| 12 | 6 | 100000 | <0 | 0 | Codeword group 4 |
| 58 | 6 | 100001 | <0 | 0 | |
| ⋮ | | | | | |
| 52 | 6 | 101111 | <0 | 0 | |
| 44 | 6 | 110000 | <0 | 1 | Codeword group 5 |
| 66 | 6 | 110001 | <0 | 1 | |
| ⋮ | | | | | |
| 1 | 7 | 1101111 | <0 | 1 | |
| 11 | 7 | 1110000 | <0 | 2 | Codeword group 6 |
| ⋮ | | | | | |
| 45 | 8 | 11101111 | <0 | 2 | |
| 53 | 8 | 11110000 | <0 | 3 | Codeword group 7 |
| ⋮ | | | | | |
| 60 | 8 | 11110111 | <0 | 3 | |

FIG. 4

| HV | CL | CW | Sign-bit | First count number | | |
|---|---|---|---|---|---|---|
| 40 | 3 | 000 | $\geq 0$ | 15 | Second codeword group 1 | First codeword group 1 |
| 67 | 4 | 0010 | $\geq 0$ | 1 | | First codeword group 2 |
| 13 | 5 | 00110 | $\geq 0$ | 1 | Second codeword group 2 | |
| 41 | 5 | 00111 | $\geq 0$ | 1 | | |
| 37 | 5 | 01000 | $\geq 0$ | 0 | | First codeword group 3 |
| ⋮ | | | ⋮ | | | |
| 49 | 5 | 01100 | $\geq 0$ | 0 | Second codeword group 3 | |
| 34 | 6 | 011010 | $\geq 0$ | 0 | | |
| ⋮ | | | | | | |
| 38 | 6 | 011111 | $\geq 0$ | 0 | | First codeword group 4 |
| 12 | 6 | 100000 | $< 0$ | 0 | | |
| ⋮ | | | | | Second codeword group 4 | |
| 52 | 6 | 101111 | $< 0$ | 0 | | |
| 44 | 6 | 110000 | $< 0$ | 1 | | |
| ⋮ | | | | | | |
| 66 | 6 | 110001 | $< 0$ | 1 | Second codeword group 5 | |
| 47 | 7 | 1100100 | $< 0$ | 1 | | |
| ⋮ | | | | | | First codeword group 5 |
| 1 | 7 | 1101111 | $< 0$ | 1 | | |
| ⋮ | | | | | ⋮ | ⋮ |

FIG. 8

HUFFMAN DECODING METHOD

BACKGROUND OF THE INVENTION

1. Field of the Invention

The present invention relates to a Huffman decoding method, and more particularly, to a Huffman decoding method which has a higher searching speed and less memory usage than conventional methods.

2. Description of the Prior Art

Huffman coding is a highly popular compression technique that is used in many standards, including MPEG AAC (Moving Picture Experts Group Advanced Audio Coding) and JPEG (joint Photographic Experts Group). It greatly compresses a stream size of audio or video media. However, Huffman coding also provides a computational burden for an encoder and especially for a decoder because Huffman decoding is one of the most computationally intensive modules in audio or video decoders. In addition, many embedded systems are dedicated decoders but have limited resources and clock rate. Therefore, these embedded systems must process the Huffman code efficiently while utilizing limited resources, such as limited memory space.

Different kinds of Huffman decoding methods have been proposed previously, and these existing decoding techniques can be divided into two categories: single bit methods and multiple bit methods. Both travel on the Huffman tree method and the method described in the JPEG standard use the single bit decoding technique. Multiple bit methods usually employ table lookup or searching techniques to find Huffman codes instead of searching codes bit by bit.

The single bit methods are very slow because the Huffman decoding results are searched bit by bit. Nowadays, audio streams or JPEG images handled in embedded systems have high bit rate or resolutions. Efficient processing of these audio streams and images is very important because most embedded systems have low clock rate to reduce system power consumption. Therefore, the single bit methods are not suitable for most embedded systems because they are inefficient in decoding Huffman codes.

The multiple bit methods were invented to speed up the Huffman decoding. Most multiple bit methods, especially table lookup approaches, decode data much faster than the single bit methods. However, the multiple bit methods use much more memory space, and therefore are not perfect for the embedded systems because most embedded systems have limited memory space in order to reduce cost and chip size.

SUMMARY OF THE INVENTION

It is therefore an objective of the present invention to provide a Huffman decoding method, which has faster code searching speed and requires less memory, and is efficiently used in most embedded systems, to solve the above-mentioned problems.

According to one embodiment of the present invention, a Huffman decoding method for decoding codewords included in an encoded data transmitted via a stream comprises: processing codewords of a codebook extracted from the stream to derive at least an auxiliary lookup table, and storing each derived auxiliary lookup table in a storage device; and searching a decoded value corresponding to a target codeword included in the encoded data according to at least the auxiliary lookup table stored in the storage device and the codebook.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 is a diagram illustrating an exemplary table according to the Huffman decoding method shown in FIG. 3.

FIG. 8 is a diagram illustrating an exemplary table according to the Huffman decoding method shown in FIG. 7.

DETAILED DESCRIPTION

Figure 1:
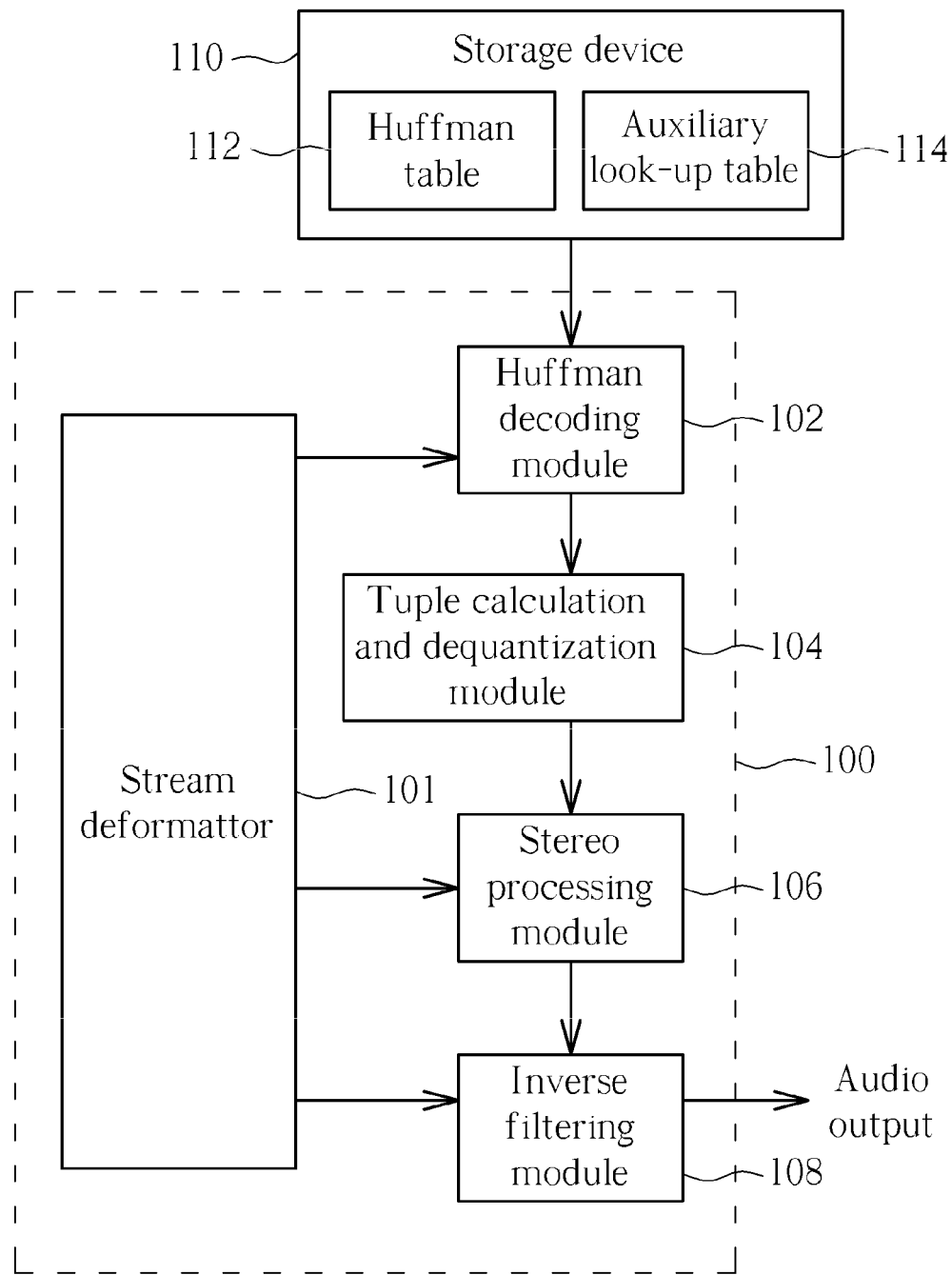
FIG. 1 is a diagram illustrating an AAC decoder according to one embodiment of the present invention.

FIG. 1 is a diagram illustrating an AAC decoder 100 according to one embodiment of the present invention, which can be implemented by either hardware or software. The decoder 100 includes a stream deformattor 101, a Huffman decoding module 102, a tuple calculation and dequantization module 104, a stereo processing module 106, and an inverse filtering module 108, where the Huffman decoding module 102 performs decoding process according to a Huffman table 112 and an auxiliary look-up table 114 stored in a storage device 110. The stream deformatter 101 acquires desired bits from an AAC stream with or without moving a stream pointer and returns them to some decoding modules (such as the Huffman decoding module 102, the stereo processing module 106 and the inverse filtering module 108) that are directly related to the stream. The Huffman table 112 contains eleven predefined spectrum codebooks and one scale factor codebook, and contents of the auxiliary look-up table 114 are derived from the at least one codebook of the Huffman table 112. In the Huffman decoding module 102, many traditional methods, such as tree traverse, can be used to decode Huffman symbols. In the tuple calculation and dequantization module 104, some two or four tuples are generated using the decoded Huffman symbols and then a dequantization procedure is applied to these tuples. Then, the stereo processing module 106 constructs dual channel outputs by using single channel dequantized results obtained from the module 104. Finally, the dual channel signals are converted into time domain audio outputs by the inverse filtering module 108. These audio outputs can be sent into any speaker systems for playback.

Figure 2:
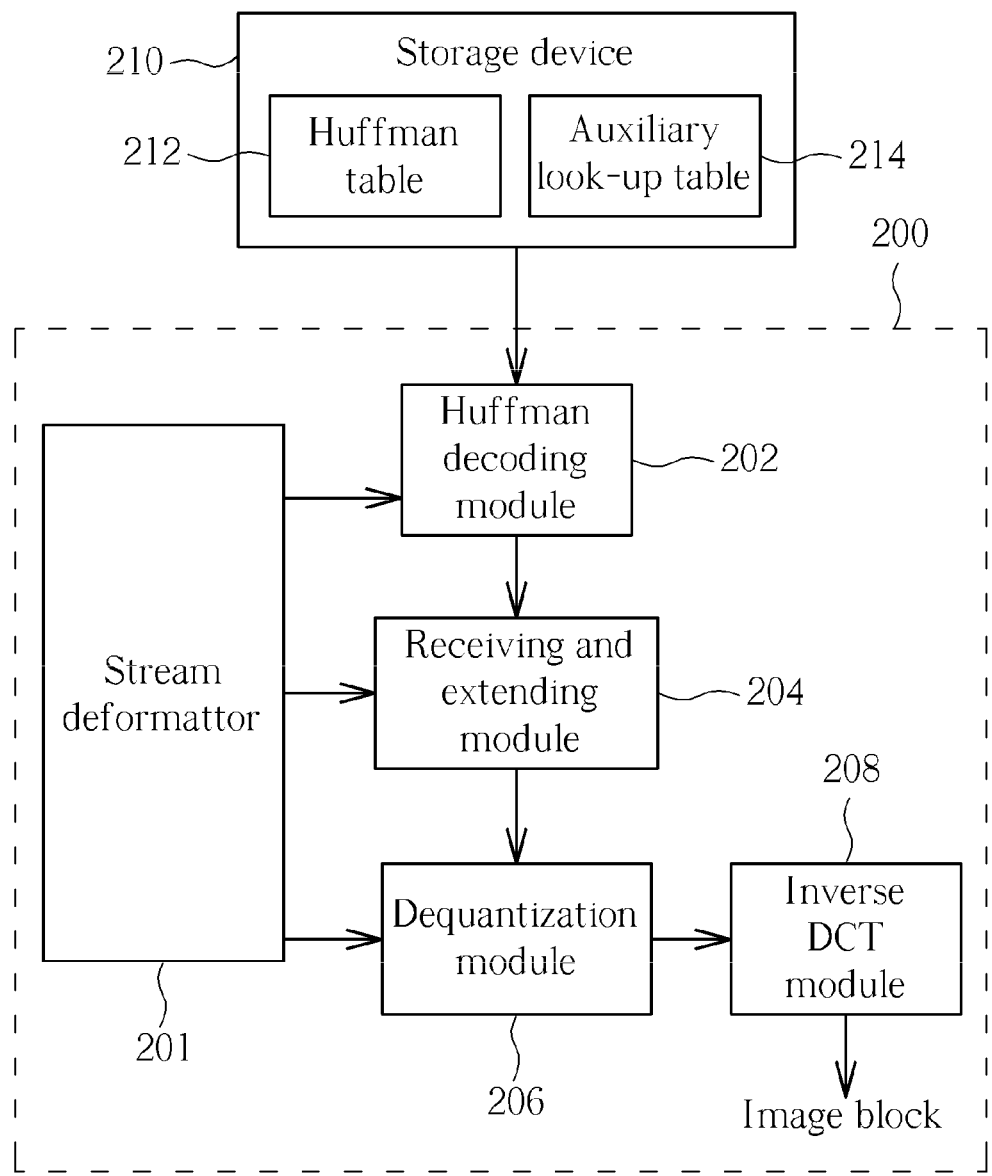
FIG. 2 is a diagram illustrating a JPEG decoder according to another embodiment of the present invention.

FIG. 2 is a diagram illustrating a JPEG decoder 200 according to another embodiment of the present invention, which can be implemented by either hardware or software. The decoder 200 includes a stream deformattor 201, a Huffman decoding module 202, a receiving and extending module 204, a dequantization module 206, and an inverse DCT (Discrete Cosine Transform) module 208, where the Huffman decoding module 202 performs decoding process according to a Huffman table 212 and an auxiliary look-up table 214 stored in a storage device 210. The stream deformatter 201 and the Huffman decoding module 202 are functionally the same as the stream deformatter 101 and the Huffman decoding module 102 shown in FIG. 1. A Huffman table is built by a setup module (not shown), because JPEG codebooks are specified in the stream instead of being predefined. By using the method described in the JPEG standard, codebooks generated for JPEG decoding have the same features as AAC codebooks. Therefore, the same decoding method can be used in module 202 for both AAC and JPEG. Then, the receiving and extending module 204 is employed to acquire quantized values from JPEG streams by using the Huffman symbols decoded in the Huffman decoding module 202. Like Huffman tables or codebooks, JPEG quantization tables are also embedded into the stream and need to be parsed. The dequantization module 206 processes receiving and extending results from the module 204 and obtains frequency domain image blocks. These image blocks in the frequency domain will be transformed into time domain image blocks by an inverse DCT module 208.

Figure 3:
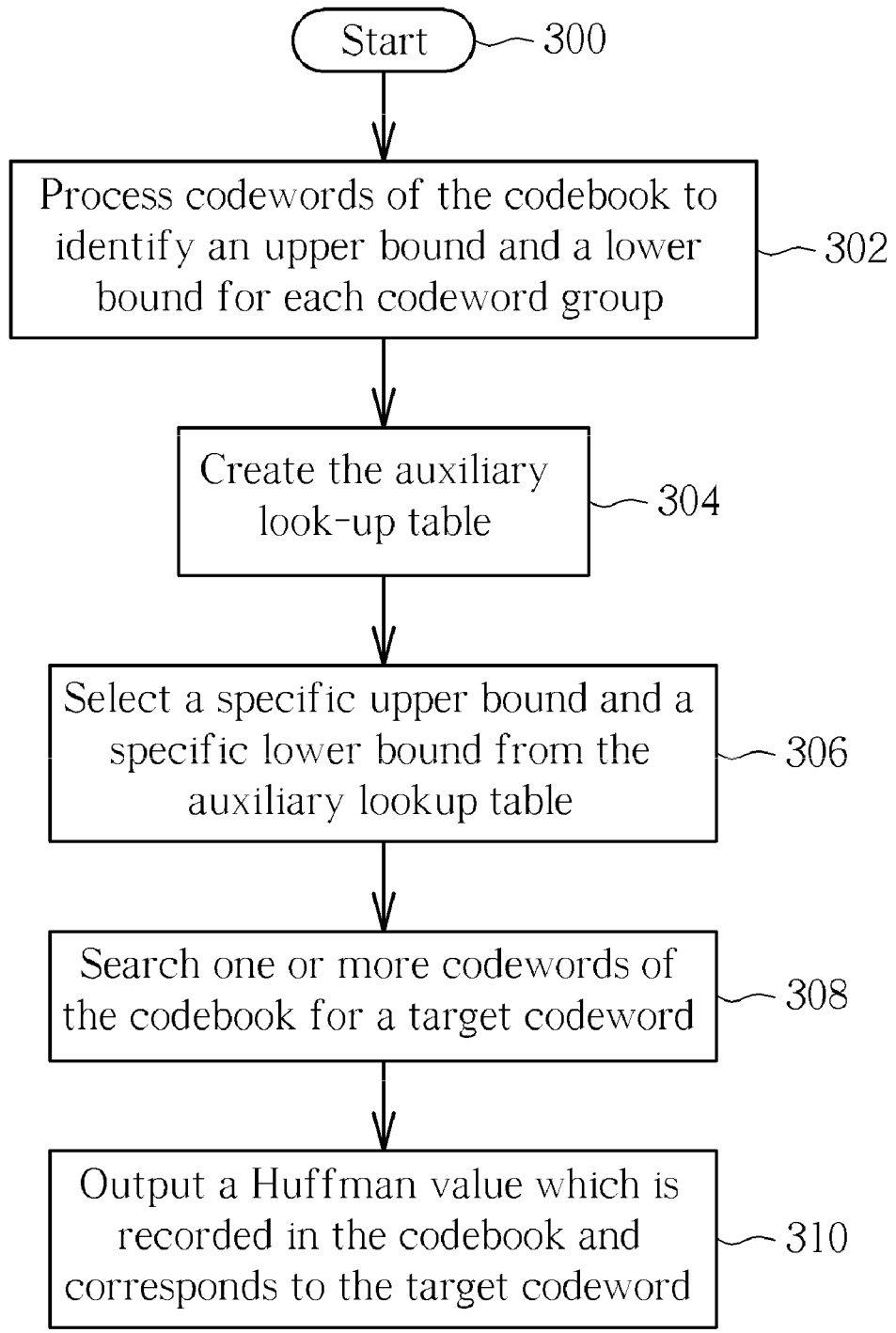
FIG. 3 is a diagram illustrating a Huffman decoding method for decoding codewords included in an encoded data transmitted via a stream according to a first embodiment of the present invention.

Please refer to FIG. 3. FIG. 3 is a diagram illustrating a Huffman decoding method for decoding codewords included in an encoded data transmitted via a stream provided by the stream deformattor 101 or 201 according to a first embodiment of the present invention. Initially, the Huffman table 112 or 212, which includes at least one codebook, is extracted from the stream and is stored in the storage device 112 or 212. It is noted that, in this embodiment, all codewords in a codebook of the Huffman table 112 or 212 are aligned to the MSB of a 16-bit word as shown in first three columns of FIG. 4, where all aligned codewords are saved into a table CW in the storage device 110 or 210. The information shown in FIG. 4 includes Huffman values (HV), code lengths (CL), codewords (CW), sign-bit, and first count numbers. Please note that the codebook shown in FIG. 4 is for illustrative purposes only, and is not meant to be a limitation of the present invention. The decoding processes of the present invention are described as follows.

In Step 300, the decoding process starts. Then, in Step 302, the codewords of the codebook are processed to identify an upper bound and a lower bound for each of a plurality of codeword groups respectively corresponding to a plurality of different bit patterns, where each codeword in a codeword group has a part of identical bit pattern as shown in FIG. 4. For example, a codeword group 2 shown in FIG. 4 has a part of identical bit pattern "001", a codeword group 4 has a part of identical bit pattern "10", and a codeword group 6 has a part of identical bit pattern "1110", . . . etc. Hence, each codeword group is delimited by the upper bound and the lower bound. In addition, in this embodiment, a number of bit(s) successively following a sign bit (i.e., Most Significant Bit, MSB) of each codeword of the codebook and identical to the sign bit are counted to derive a first count value which is used to recognize different bit patterns, and each codeword in a codeword group has the same first count number. For example, the codeword "00110" has a first count number "1"; and the codeword "11101111" has a first count number "2".

Then, in Step 304, the auxiliary look-up table 114 or 214 is created, and the auxiliary look-up table records an upper bound and a lower bound of each of the codeword groups. In addition, in this embodiment, the upper bound and the lower bound for each of the codeword groups is identified according to the first count numbers respectively corresponding to the codewords of the codebook. For example, for the codeword group 2, the auxiliary look-up table stores information of the upper bound (directed to CW=0010) and the lower bound (directed to CW=00111); and for the codeword group 4, the auxiliary look-up table stores information of the upper bound (directed to CW=100000) and the lower bound (directed to CW=101111).

In Step 306, a specific upper bound and a specific lower bound are selected from the auxiliary lookup table according to the encoded data. The Huffman decoding module 102 or 202 receives the encoded data from the stream deformattor 101 or 201 and determine which codeword group the encoded data belonging to. In addition, in this embodiment, the Huffman decoding module 102 or 202 determine a number of bit(s) successively following a sign bit (i.e., MSB) of the encoded data and identical to the sign bit to derive a second count number of the encoded data. The Huffman decoding module 102 or 202 determine to which codeword group the encoded data belonging according to the second count number and the sign-bit of the encoded data. For example, when the second count number of the encoded data is "1" and a sign bit of the encoded data is greater than "0" (sign bit >=0), the encoded data belongs to codeword group 2. The upper bound and lower bound of the codeword group 2 serve as a specific upper bound and a specific lower bound. When the second count number of the encoded data is "2" and a sign bit of the encoded data is less than "0" (sign bit <0), the encoded data belongs to codeword group 6. The upper bound and lower bound of the codeword group 6 serve as the specific upper bound and the specific lower bound.

Then, in Step 308, one or more codewords of the codebook are searched for a target codeword corresponding to the encoded data by referring to the specific upper bound and the specific lower bound. In particular, in this embodiment, when only a specific codeword of the codebook is delimited by the specific upper bound and the specific lower bound (e.g., codeword group 1 shown in FIG. 4), the specific codeword of the codebook is identified as the target codeword; and when a plurality of specific codewords of the codebook is delimited by the specific upper bound and the specific lower bound (e.g., codeword groups 2-7 shown in FIG. 4), a binary search is performed upon the specific codewords of the codebook to find the target codeword. That is, comparing the encoded data and the specific codewords to find the target codeword.

Finally, in Step 310, a Huffman value which is recorded in the codebook and corresponds to the target codeword is outputted for indicating decoded data. For example, when the target codeword is "100000", a Huffman value "12" is outputted; and when the target codeword is "11110000", a Huffman value "53" is outputted for indicating decoded data.

One advantage of the Huffman decoding method of the present invention shown in FIGS. 3 and 4 is as follows: when a Huffman value needs to be searched according to the encoded data, only one codeword group shown in FIG. 4 is required to be a searching range and the codeword group can be determined very efficiently by the second count number of the encoded data. Compared with a conventional Huffman decoding method which uses whole codeword groups shown in FIG. 4 as the searching range, the Huffman decoding method of the present invention saves memory space and speeds up a procedure of searching Huffman value(s).

Figure 5A:
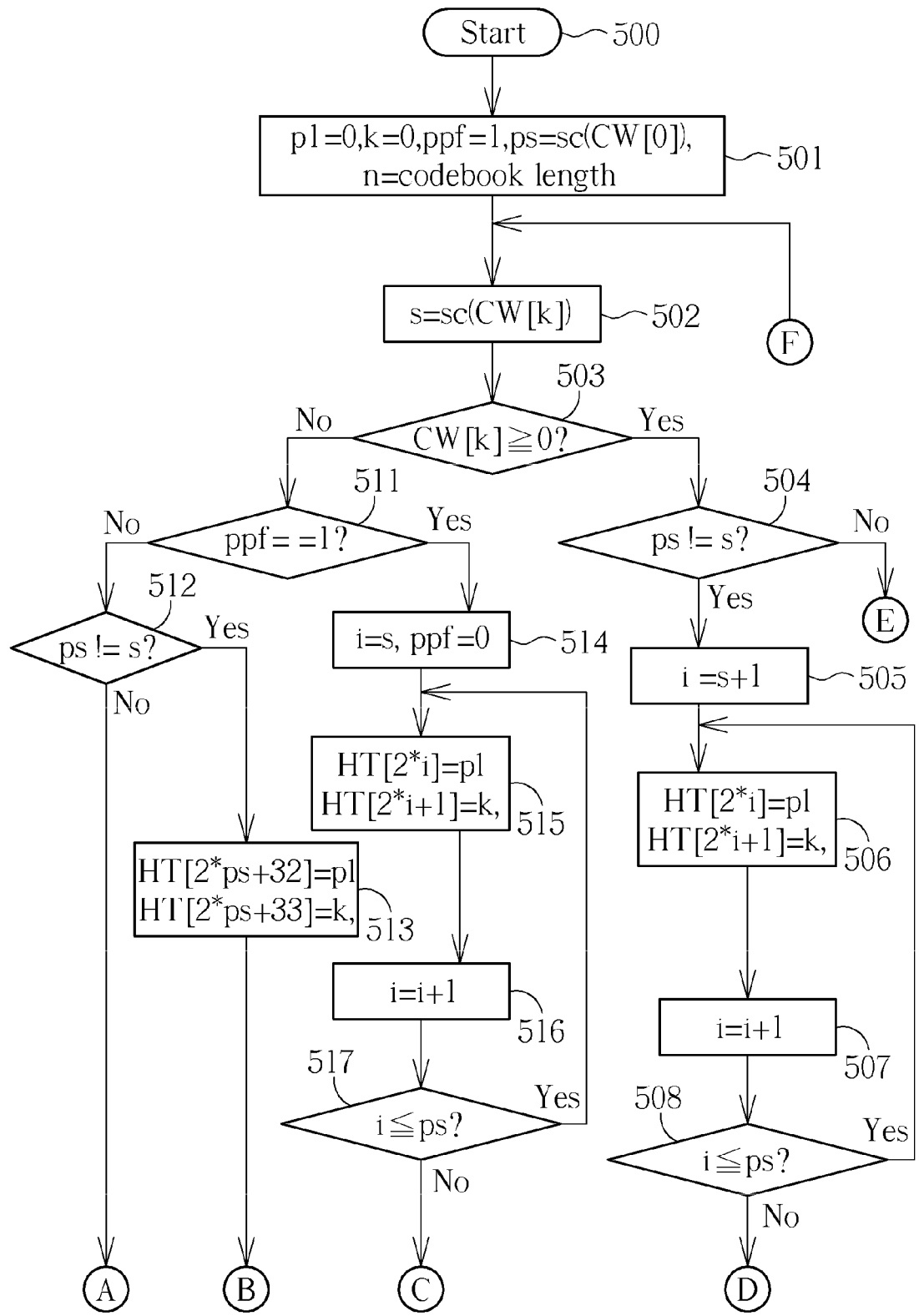
FIGS. 5A and 5B are diagrams illustrating a detailed flow of creating the auxiliary look-up table shown in FIG. 3.
Figure 5B:
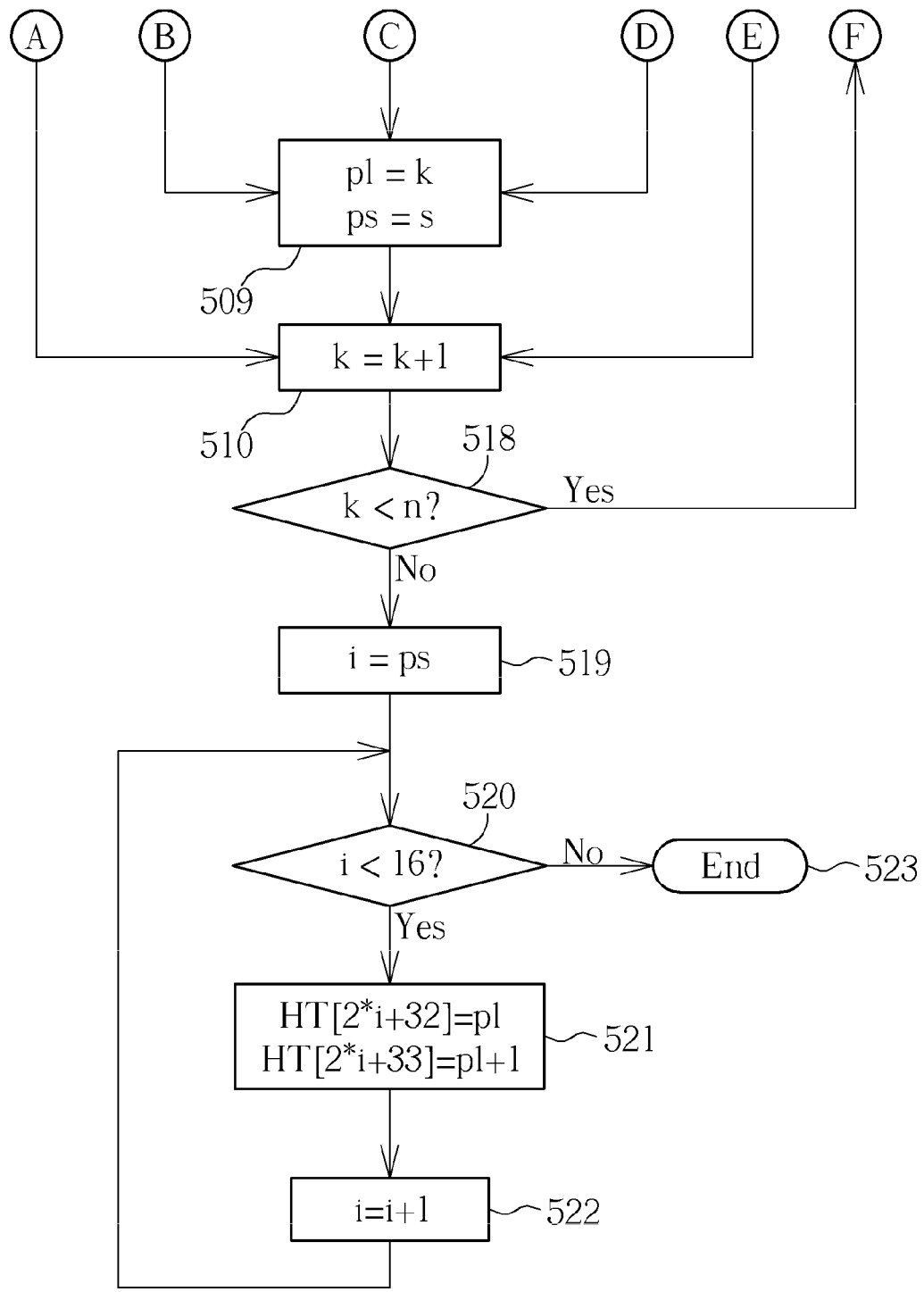

Please refer to FIGS. 5A and 5B, which are diagrams illustrating a detailed flow of creating the auxiliary look-up table HT in Step 304 shown in FIG. 3. As shown in FIGS. 5A and 5B, in Step 500, a process starts. Then, in an initialization step (Step 501), codeword index k, and a variable pl are cleared to be "0". A function 'sc' counts a number of bit(s) which successively follow a sign bit of each codeword of the codebook and are identical to the sign bit to generate a first count number, and a variable 'ps' is determined by the first count number of a first codeword CW[0], that is ps=sc (CW [0]). Please note that, in many embedded processors, the function sc can be implemented by a single instruction. A codebook length, that is the number of codewords in a codebook, is saved to n, and a variable ppf is set to 1.

The flow will go through all codewords in a codebook to generate the auxiliary look-up table. For every codeword, the function sc will be issued first to get a first count number s of this codeword (Step 502). Then, the sign (that is a MSB of a codeword CW[k]) is checked (Step 503). If the codeword CW[k]>=0, the flow enters Step 504 and the relationship between ps and s is checked. If ps is equal to s, the codeword index is increased by an increment of one (i.e., k=k+1) (Step 510) and is checked if it is a last codeword (Step 518); if it is not the last codeword, the flow goes back to Step 502 to get a first count number of next codeword. If the variable ps is not equal to s, an index i of the auxiliary look-up table is initialized by i=s+1 (Step 505). Then, in Steps 506-508, elements of the auxiliary look-up table are set as HT[2*i]=pl, and HT[2*i+1]=k until the index i==ps. When the index i>ps, the flow enters Step 509 and the variables pl and ps are updated by pl=k and ps=s, respectively. Then, the codeword index k is increased and then checked to determine whether it reaches the end of the codebook (Step 510 and 518).

If the codeword CW[k]<0, it is checked if the variable ppf is equal to 1 (Step 511). If yes, ppf is cleared and the index i is initialized as s (Step 514). Similar to the Steps 506-508 described above, the index i is looped until i==ps, and elements of the auxiliary look-up table are set as HT[2*i]=pl, and HT[2*i+1]=k (Steps 515-517). After the loop for the index i is finished, both pl and ps are updated and the codeword index k is increased and checked (Step 510 and 518). If ppf is not equal to 1, the variable ps is checked to see if it is equal to s (Step 512). If not, two elements of the auxiliary look-up table HT[2*ps+32] and HT[2*ps+33] are set as pl and k, respectively (Step 513). Then, the variables pl and ps are set to k and s, respectively (Step 509), and the codeword index k is increased and checked (Step 510 and 518). If ps is equal to s, the codeword index k is increased and checked directly (Step 510 and 518).

When the flow has already gone through all codewords in a codebook, i.e., codeword index k==n, the index i is initialized as ps (Step 519). If the index i>=16, the flow of creating the auxiliary look-up table is finished. If the index i<16, a loop (Steps 520-522) is performed until i==16 is reached. In this loop, elements of the auxiliary look-up table HT[2*i+32] and HT[2*i+33] are set to pl and (pl+1), respectively (Step 521).

Figure 6:
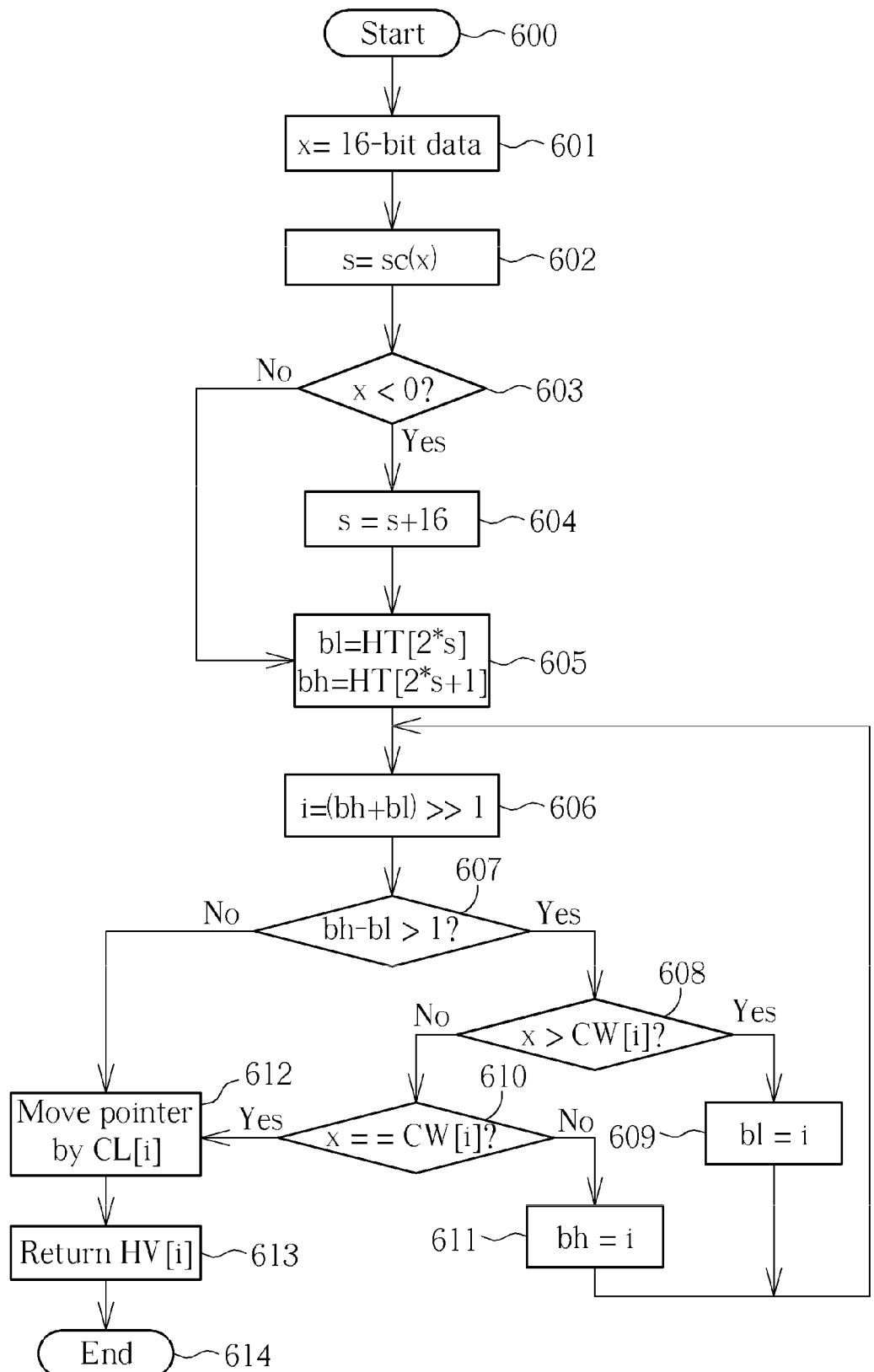
FIG. 6 is a diagram illustrating a detailed flow of searching the Huffman value by using the auxiliary look-up table generated in the flow described in FIGS. 5A and 5B.

Please refer to FIG. 6, which is a diagram illustrating a detailed flow of searching the Huffman value in Steps 306-310 by using the auxiliary look-up table HT generated in the flow described in FIGS. 5A and 5B. As shown in FIG. 6, in Step 600, a process starts. In Step 601, a 16-bit encoded data should be fetched from AAC or JPEG stream without moving the reading pointer and saved to x. Considering the 16-bit data as a signed integer number, a number of bit(s) which successively follow a sign bit of the 16-bit encoded data and are identical to the sign bit are counted to derive a second count number by using the function 'sc', and the second count number returned from the function 'sc' is saved into variable s (Step 602). Then, in Step 603, it is determined if the 16-bit encoded data x is less than 0: if the 16-bit encoded data x is less than 0, the second count number s needs to be updated by adding 16 and then the updated s will be used as an index of the auxiliary look-up table HT (Step 604). Otherwise, the second count number s will be used as the index of the auxiliary look-up table directly. Then, elements obtained from the auxiliary look-up table HT[2*s] and HT[2*s+1] are saved into variable bl and bh, respectively (Step 605).

Then, in Step 606, an index i is calculated by i=(bh+bl)>>1, where ">>" is a bit shift operator and the integer sum of bh and bl will be right shifted by 1. This index i is used as the index of three essential Huffman decoding tables: codeword table CW, codeword length table CL, which stores bit widths of all codewords in a codebook, and Huffman value table HV as shown in the first three columns in FIG. 4. Then, in Step 607, the difference between bh and bl (that is (bh−bl)) is compared with 1: if the difference is larger than 1, the 16-bit encoded data x need to be compared with the codeword CW[i] (Step 608). Regarding the comparison in Step 608, the 16-bit x and codeword CW[i] should be treated as unsigned integer numbers. If x>CW[i], the variable bl will be updated as bl=i (Step 609); otherwise, if x !=CW[i], the variable bh will be updated as bh=i (Step 611). After updating either the variable bl or bh, the decoding flow will go back to Step 606. If x==CW[i], that is, the codeword index that will be used to fetch Huffman decoding results is found, the flow will go to get a code length CL[i] (Step 612), move the stream pointer and return a Huffman value HV[i] (Step 613) which is the final decoding result. In addition, returning to Step 607, if the difference (bh−bl) is not larger than 1, the current index i is also the final index that needs to be looked for, so the decoding flow will go to the final steps: getting CL[i], moving stream pointer and returning Huffman value HV[i] (Steps 612-613).

Figure 7:
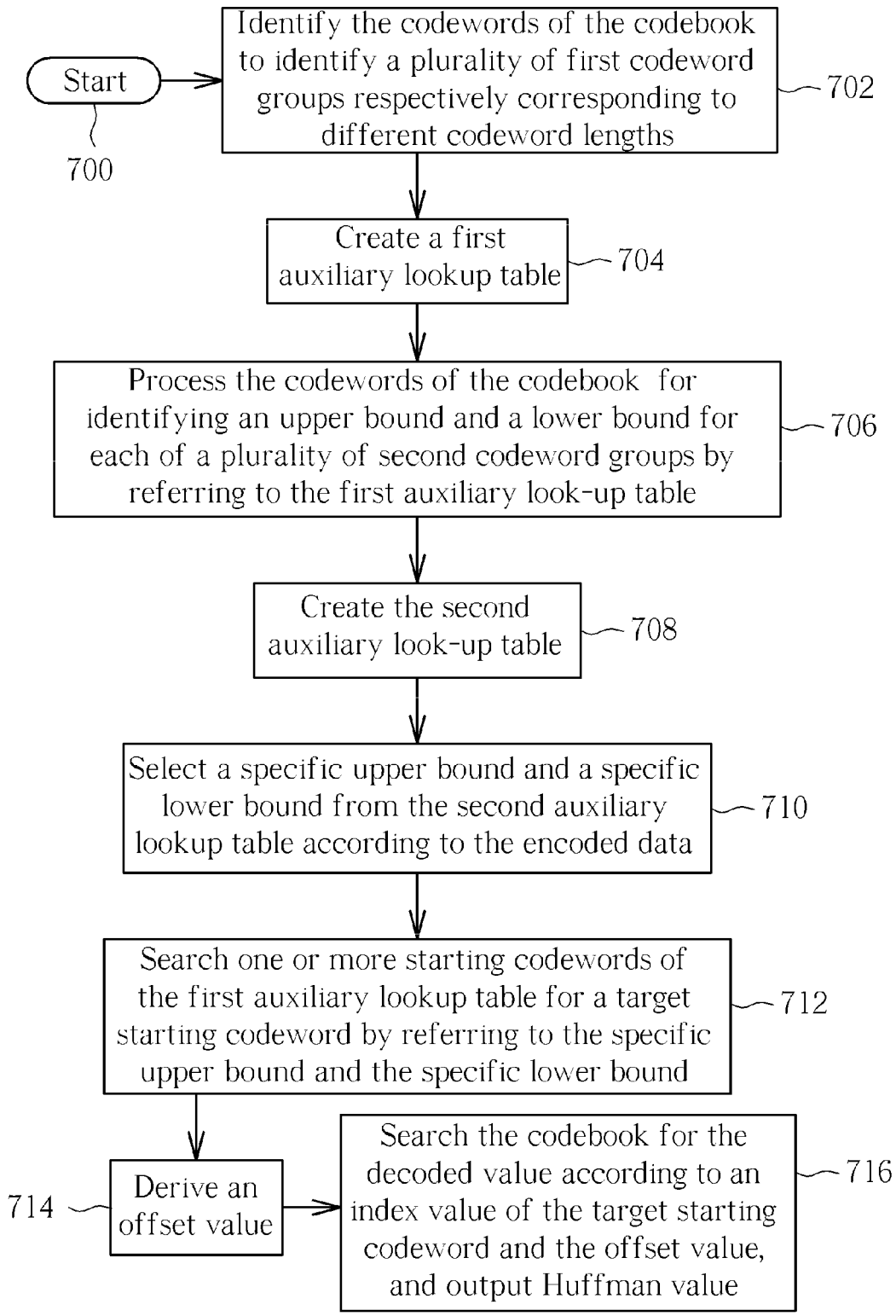
FIG. 7 is a diagram illustrating a Huffman decoding method for decoding codewords included in an encoded data transmitted via a stream according to a second embodiment of the present invention.

Please refer to FIG. 7. FIG. 7 is a diagram illustrating a Huffman decoding method for decoding codewords included in an encoded data transmitted via a stream provided by the stream deformattor 101 or 201 according to a second embodiment of the present invention. Initially, the Huffman table 112 or 212, which includes at least one codebook, is extracted from the stream and is stored in the storage device 112 or 212. It is noted that, in this embodiment, all codewords in a codebook of the Huffman table 112 or 212 are aligned to the MSB of a 16-bit word as shown in the first three columns of FIG. 8, where all aligned codewords are saved into a table CW in the storage device 110 or 210. The information shown in FIG. 8 includes Huffman values (HV), code lengths (CL), codewords (CW), sign bit, and first count numbers. Please note that the codebook shown in FIG. 8 is for illustrative purposes only, and is not meant to be a limitation of the present invention. The decoding processes of the present invention are described as follows.

In Step 700, the decoding process starts. Then, in Step 702, the codewords of the codebook are processed to identify a plurality of first codeword groups respectively corresponding to a plurality of different codeword lengths, wherein each codeword in the same first codeword group has the same codeword length as shown in FIG. 8. For example, as shown in FIG. 8, a first codeword group 3 includes codewords with codeword length equal to 5; and a first codeword group 4 includes codewords with codeword length equal to 6.

Then, in Step 704, a first auxiliary lookup table which records a sequence number of a first codeword group to which each of the codewords of the codebook corresponds is created, and the first auxiliary lookup table records a starting codeword, an index value of the starting codeword in the codebook, and a codeword length to which each of the first codeword groups corresponds, where each codeword in the same first codeword group corresponds to the same sequence number. For example, the starting codeword of the first codeword group 3 is "00110", and the sequence number thereof is 2.

Then, in Step 706, the codewords of the codebook is processed for identifying an upper bound and a lower bound for each of a plurality of second codeword groups by referring to the first auxiliary look-up table, where the upper bound and the lower bound of the second codeword group are an upper bound and a lower bound of sequence numbers of one or more first codeword groups which have at least one identical codeword with the second codeword group. The second codeword groups here correspond to a plurality of different bit patterns, respectively, and each codeword in the same second codeword group has a part of identical bit pattern as shown in FIG. 8. For example, a second codeword group 2 shown in FIG. 8 has a part of identical bit pattern "001", a second codeword group 3 has a part of identical bit pattern "01", and a codeword group 5 has a part of identical bit pattern "110", . . . etc. In addition, in this embodiment, a number of bit(s) successively following a sign bit (i.e., MSB) of each codeword of the codebook and identical to the sign bit are counted to derive a first count value which is used to recognize different bit patterns, and each codeword in the same codeword group has the same first count number.

Then, in Step 708, the second auxiliary look-up table is created and the second auxiliary look-up table records an upper bound and a lower bound of each of the second codeword groups. In addition, in this embodiment, the upper bound and the lower bound for each of the second codeword groups is identified according to the first count numbers respectively corresponding to the codewords of the codebook. The second auxiliary look-up table records which first codeword group the codeword of each second code word group falls in. For example, the codeword "01000"-"01100" fall in the second codeword group 3 and also fall in the first group 3. The codeword "011010"-"011111" fall in the second codeword group 3 and also fall in the first group 4. Hence, the second auxiliary look-up table records the second codeword group 3 involving first codeword groups 3 and 4 and also records the starting codeword of involved first codeword group (i.e. the starting codeword "00110" of the first codeword group 3 and the starting codeword "011010" of the first codeword group 4). In implementation, the second auxiliary look-up table records the second codeword group 3 involving sequence numbers 2 and 3, respectively corresponding to the first codeword groups 3 and 4.

In Step 710, a specific upper bound and a specific lower bound are selected from the second auxiliary lookup table according to the encoded data. The Huffman decoding module 102 or 202 receives the encoded data from the stream deformattor 101 or 201 and determine which second codeword group the encoded data belonging to. In addition, in this embodiment, the Huffman decoding module 102 or 202 determine number of bit(s) successively following a sign bit (i.e., MSB) of the encoded data and identical to the sign bit to derive a second count number of the encoded data, and the specific upper bound and the specific lower bound corresponding to the second count number are selected from the second auxiliary lookup table. The Huffman decoding module 102 or 202 determine to which codeword group the encoded data belonging according to the second count number and the sign-bit of the encoded data. The detail of determining is similar to Step 306 illustrated above and therefore is omitted.

Then, in Step 712, the specific upper bound and the specific lower bound are referred to search one or more starting codewords of the first auxiliary lookup table for a target starting codeword. In particular, in this embodiment, when only a specific starting codeword of the first auxiliary lookup table is delimited by the specific upper bound and the specific lower bound (e.g., first codeword group 1 shown in FIG. 8), the specific starting codeword of the first auxiliary lookup table is identified as the target starting codeword; and when a plurality of specific starting codewords of the first auxiliary lookup table is delimited by the specific upper bound and the specific lower bound (e.g., first codeword groups 3-5 shown in FIG. 8), a binary search is performed upon the specific starting codewords to find the target starting codeword. In this way, the executed binary search can be greatly simplified, since only a few specific starting codewords and the encoded data have to be compared. For example, as shown in FIG. 8, if the upper bound and the lower bound of the second codeword group 3 serve as the specific upper bound and the specific lower bound, respectively, two starting codewords (CW=00110 of the first codeword group 3 and CW=011010 of the first codeword group 4) of the first auxiliary lookup table are searched for the target starting codeword. For example, if the encoded data is "011111", the target starting codeword will be the starting code word smaller than the encoded data and closest to the encoded data, i.e. "011010". If the encoded data is "01100", the target starting codeword will be the starting code word smaller than the encoded data and closest to the encoded data, i.e. "00110".

Then, in Step 714, an offset value is derived according to a difference between the target starting codeword and the encoded data. The detail of deriving the offset value will be illustrated below (e.g. Step 1112 in FIG. 11). Finally, in Step 716, the codebook for the decoded value is searched according to an index value of the target starting codeword and the offset value, and a Huffman value is outputted.

Figure 9:
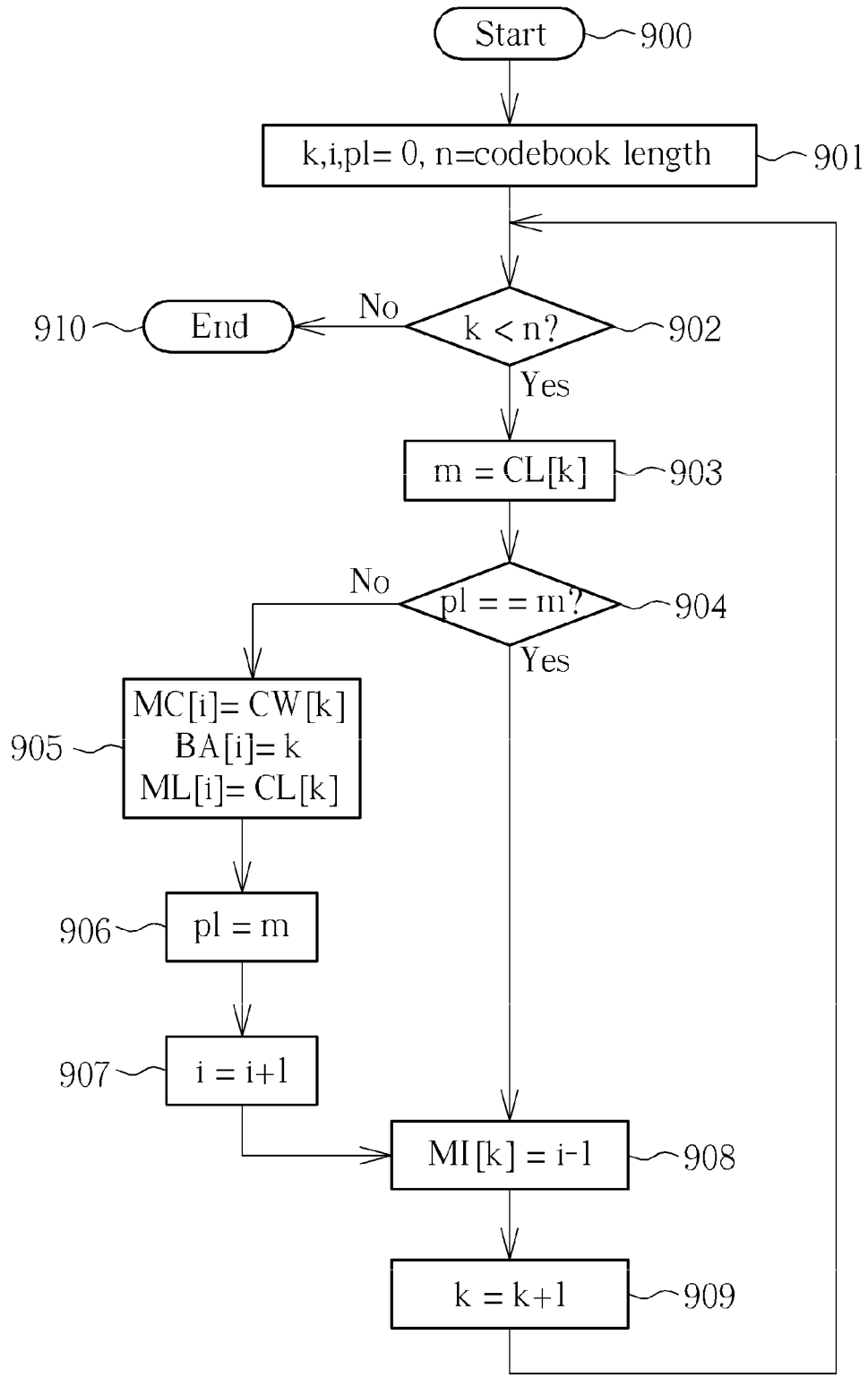
FIG. 9 is a diagram illustrating a detailed flow of creating an intermediate table MI and three decoding sub-tables MC, BA and ML of the first auxiliary look-up table.

Please refer to FIG. 9, which is a diagram illustrating a detailed flow of creating the first auxiliary look-up table. The first auxiliary look-up table includes one intermediate table MI and three decoding sub-tables MC, BA and ML in Steps 702-704. MI[i] is a sequence number of a first codeword group to which each of the codewords of the codebook corresponds, MC[i] is a starting codeword of the first codeword group, BA[i] is an index value of the starting codeword in the codebook, and ML[i] is a codeword length to which each of the first codeword groups corresponds. As shown in FIG. 9, in Step 900, a process starts. Then, in Step 901, variables k, i, and pl are initialized as 0 and codebook length is saved to a variable n. In Step 902, the codeword index k is checked if k is smaller than the codebook length n; if not, the flow enters Step 910 and the procedure of creating the first auxiliary look-up table is finished; and if k is smaller than n, the codeword length CL[k] is determined and recorded into variable m (Step 903). Then, in Step 904, the codeword length m is compared with variable pl: if pl is equal to m, an element of MI[k] is set as (i−1) (Step 908); if pl is not equal to m, elements of three sub-tables are updated as, respectively, MC[i]=CW[k], BA[i]=k, and ML[i]=CL[k] (Step 905). Then, the variable pl is set as m (Step 906) and the index i is updated by (i+1) (Step 907). After updating all these variables and table elements, the elements of MI[k] are set as (i−1) (Step 908). Finally, the index k is increased by an increment of one (Step 909) and the flow goes back to Step 902.

Figure 10A:
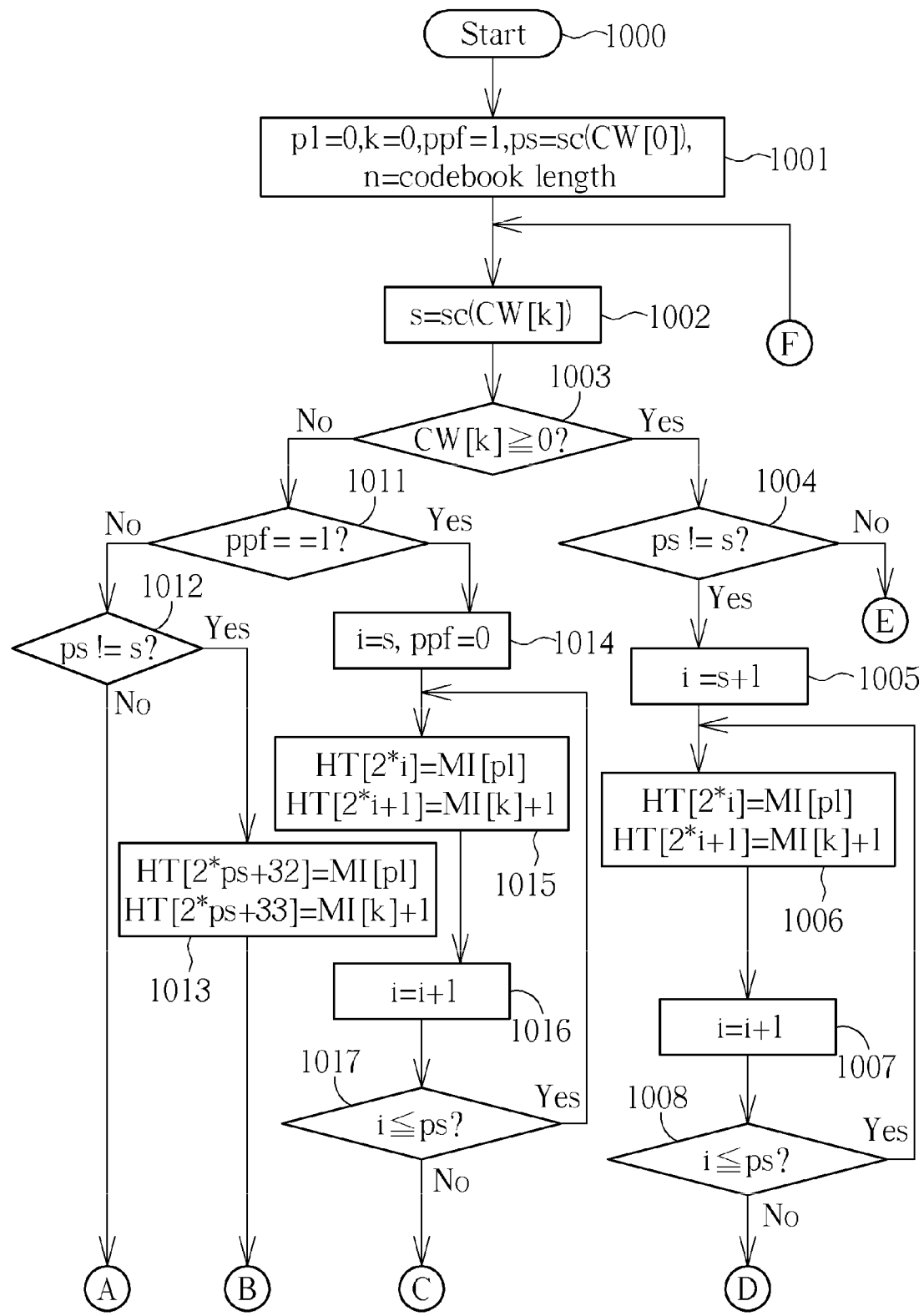
FIGS. 10A and 10B are diagrams illustrating a detailed flow of creating the second auxiliary look-up table HT.
Figure 10B:
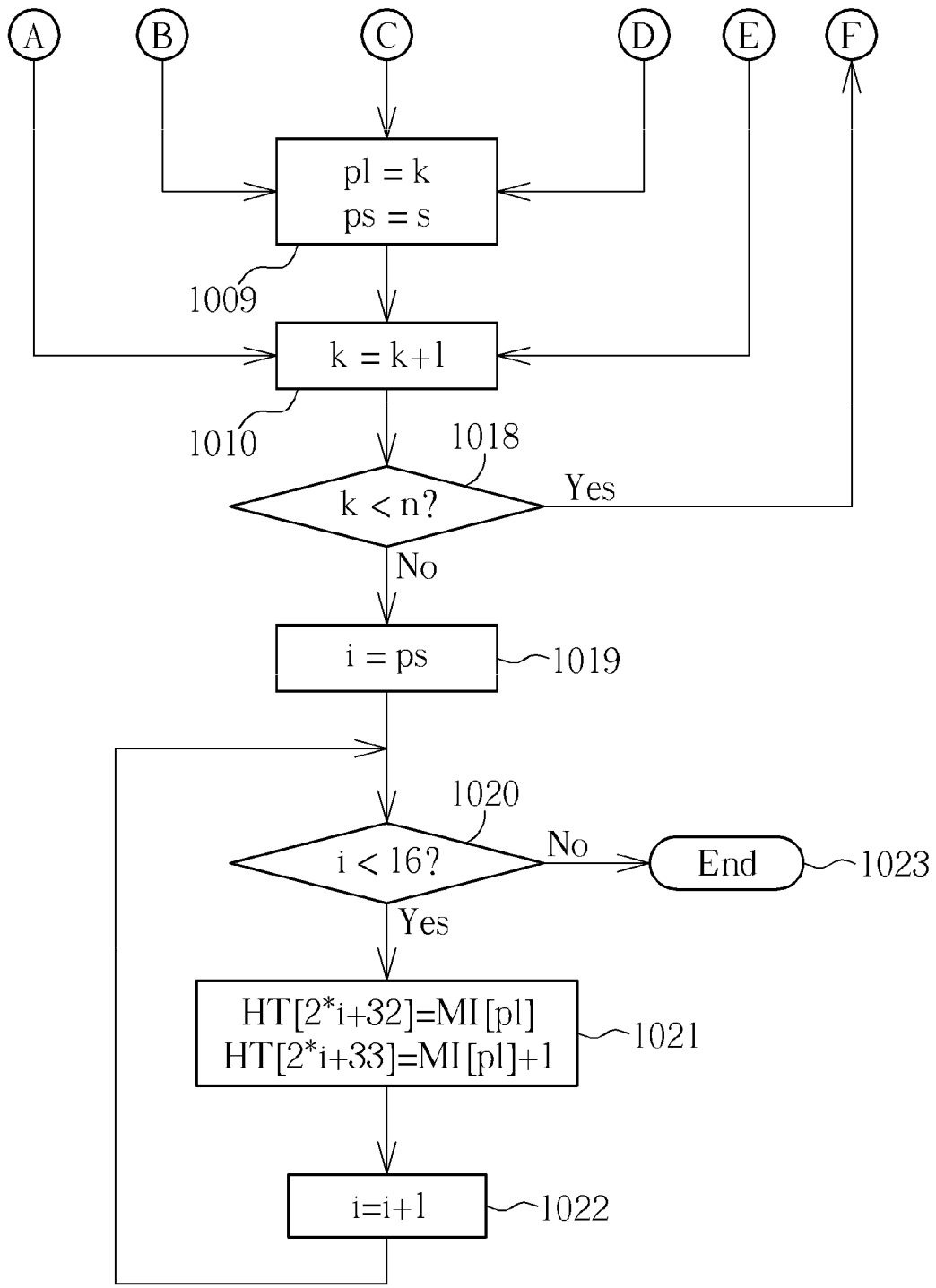

Please refer to FIGS. 10A and 10B, which are diagrams illustrating a detailed flow of creating the second auxiliary look-up table HT. The flow shown in FIGS. 10A and 10B is similar to the flow shown in FIGS. 5A and 5B. A major difference between the flows of FIG. 5 and FIG. 10 is that the intermediate table MI generated in the flow of FIG. 9 is used to set up the second auxiliary look-up table HT. In Step 1000, the process starts. In Step 1001, variables pl, and codeword index k are initialized as 0, and variable ppf is set to 1. Variable ps is initialized as a first count number of first codeword CW[0] and codebook length is saved into variable n, where the first count number is determined by counting a number of bit(s) which successively follow a sign bit of each codeword of the codebook and are identical to the sign bit.

The first count number of each codeword is still obtained by the function 'sc' and saved into s (Step 1002). Every codeword CW[k], as a 16-bit signed integer number, needs to be checked to determine if it is less than 0 (Step 1003). If CW[k]>=0 and ps==s (Step 1004), the index k is increased by an increment of one and it is checked whether all codewords have been processed (Steps 1010 and 1018). If CW[k]>=0 and ps !=s, a variable i is initialized as s+1 (Step 1005). Then, two elements of the second auxiliary look-up table are updated by HT[2*i]=MI[pl] and HT[2*i+1]=MI[k]+1 (Step 1006). The variable i is then increased by an increment of one (Step 1007) and it is checked whether i<=ps (Step 1008); if yes, the flow goes back to Step 1006; if the variable i is greater than ps, then pl and ps are set as k and s, respectively (Step 1009).

If CW[k]<0 and ppf==1 (Step 1011), ppf is cleared by 0 and the variable i is set as s (Step 1014). Similarly, two elements of the second look-up table are updated as HT[2*i]=MI[pl] and HT[2*i+1]=MI[k]+1 (Step 1015). Then, the index i is increased by an increment of one (Step 1016) and is compared with ps (Step 1017). If i<=ps, the flow goes back to Step 1015; otherwise, the variable pl and ps are updated by k and s (Step 1009). If CW[k]<0 and ppf !=1, it is determined if ps !=s (Step 1012), if yes, two elements of the second look-up table are updated by HT[2*ps+32]=MI[pl] and HT[2*ps+33]=MI[k]+1 (Step 1013), and the variables pl and ps are then updated by pl=k and ps=s (Step 1009). If the variable ps is equal to s (Step 1012), the index k is increased by an increment of one (Step 1010).

The increased index k is used to check whether all codewords have been processed (Step 1018). If not, the procedure will go back to Step 1002; otherwise, the variable i is set to ps (Step 1019). In Step 1020, it is determined if i<16, If no, the flow is finished (Step 1023); otherwise, two elements of the second auxiliary look-up table are updated as HT[2*i+32]=MI[pl] and HT[2*i+33]=MI[pl]+1 (Step 1021). Then the variable i is increased by an increment of one (Step 1022) and the flow goes back to Step 1020. The output of this flow shown in FIG. 10 is the second auxiliary look-up table HT, which will be used together with the other three decoding tables: MC, BA and ML to decode Huffman codes of JPEG or AAC.

Figure 11:
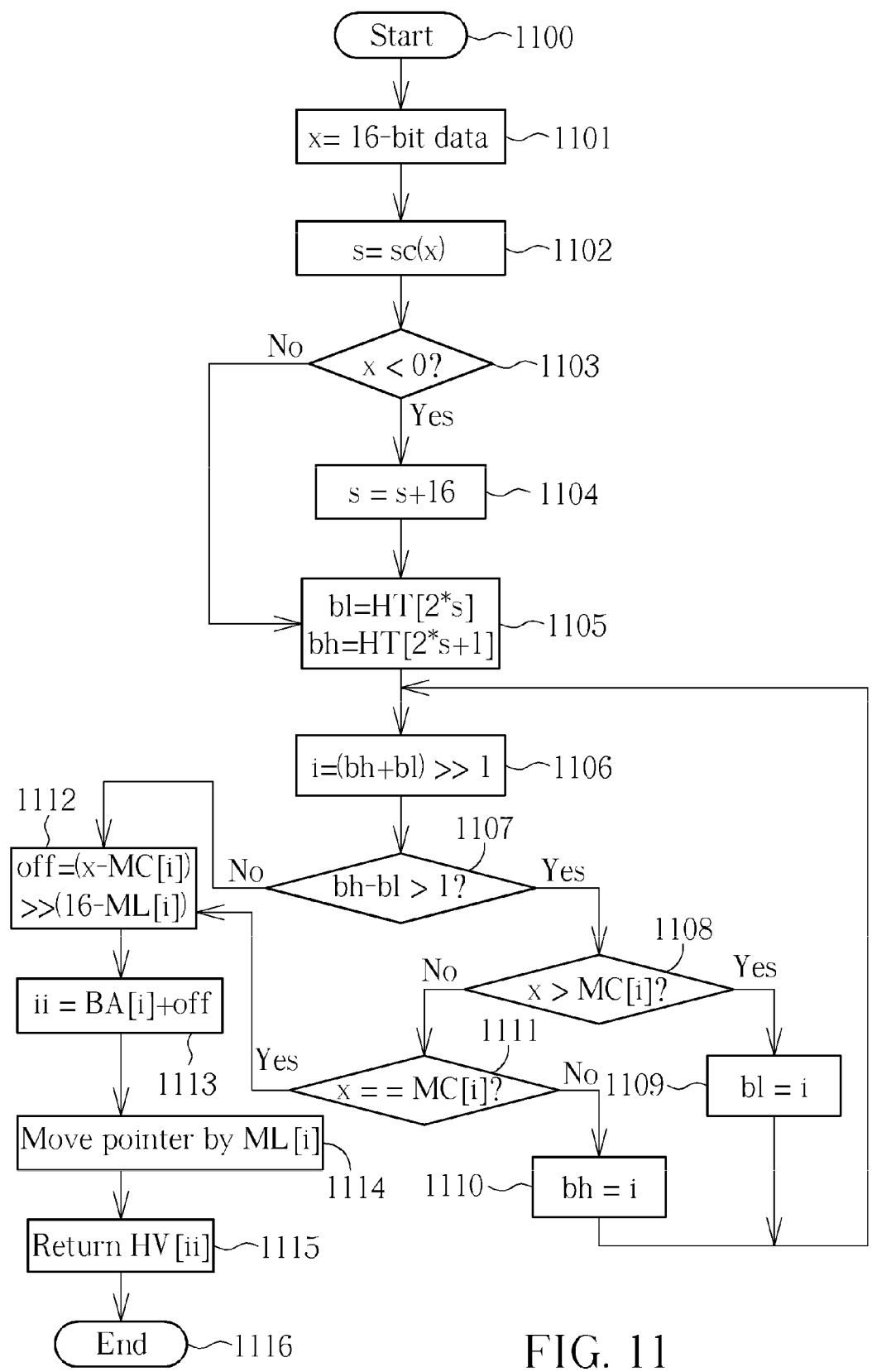
FIG. 11 is a diagram illustrating a detailed flow of searching the Huffman value by using the first auxiliary look-up table generated in the flow described in FIG. 9 and the second auxiliary look-up table HT generated in the flow described in FIGS. 10A and 10B.

Please refer to FIG. 11, which is a diagram illustrating a detailed flow of searching the Huffman value in Steps 710-716 by using the first auxiliary look-up table MC, BA and ML generated in the flow described in FIG. 9 and the second auxiliary look-up table HT generated in the flow described in FIGS. 10A and 10B. As shown in FIG. 11, in Step 1100, a decoding process starts. In Step 1101, an integer number x is used to save 16-bit data read from JPEG or AAC stream without moving the pointer. The second count number of x is saved into variable s (Step 1102). Then, in Step 1103, it is determined if x<0: if x is less than 0, the variable s is updated by s=s+16 (Step 1104), and two elements of the second auxiliary look-up table HT[2*s] and HT[2*s+1] are used to initialize variables bl and bh, respectively (Step 1105).

Then, in Step 1106, an index i is generated by i=(bh+bl)>>1, where ">>" is a bit shift operator. After that, the difference between bh and bl, that is (bh−bl), is compared with 1 (Step 1107). If the difference is larger than 1, the flow enters Step 1108, otherwise the flow enters Step 1112. In Step 1108, the variable x is compared with the codeword MC[i], which is generated in the flow in FIG. 9, as unsigned integer numbers. If x>MC[i], variable bl is set as i (Step 1109); otherwise, it is checked if x==MC[i] (Step 1111). If x !=MC[i], the variable bh is set as i (Step 1110). After updating either bl or bh (Step 1109 or 1110), the flow goes back to Step 1106. If x==MC[i], the flow enters Step 1112.

In Step 1112, a variable 'off' is calculated by shifting (x−MC[i]) by (16−ML[i]), where MC[i] is the codeword and ML[i] is its codeword length. That is, calculating a binary difference value between the encoded data and the target starting codeword, and the variable 'off' is equal to shifting the binary difference value by (16−ML[i]). Then, a variable ii is calculated by using ii=BA[i]+off (Step 1113), where BA[i] is the index value of the starting codeword generated in the flow of FIG. 9. Finally, the final decoding result is the Huffman value HV[ii] and the stream pointer needs to be moved by ML[i] (Steps 1114 and 1115). After returning the Huffman value HV[ii], the flow is finished.

In addition, in the AAC decoder 100 shown in FIG. 1 and the JPEG decoder 200 shown in FIG. 2, the Huffman table 112 or 212 and the auxiliary look-up table 114 or 214 are stored in the same storage device 110 or 210. In other embodiments, however, the Huffman table and the auxiliary look-up table can be built in different storage devices. This alternative design falls within the scope of the present invention.

It is noted that the Huffman decoding methods shown in FIG. 3 and FIG. 7 are applied in the AAC decoder 100 shown in FIG. 1 and the JPEG decoder 200 shown in FIG. 2. In other embodiments, however, the Huffman decoding methods of the present invention can also be applied to any other decoding apparatus using Huffman decoding.

Briefly summarized, the Huffman decoding method of the present invention for decoding codewords included in an encoded data transmitted via a stream includes: processing codewords of a codebook that is predefined or extracted from the stream to derive at least an auxiliary lookup table, and storing each derived auxiliary lookup table in a storage device; and searching a decoded value corresponding to a target codeword included in the encoded data according to at least the auxiliary lookup table stored in the storage device and the codebook. By using the auxiliary lookup table to decode the encoded data, the code searching speed is faster and less memory is required. Therefore, the Huffman decoding method is efficiently used in most embedded systems.

Those skilled in the art will readily observe that numerous modifications and alterations of the device and method may be made while retaining the teachings of the invention.

What is claimed is:

1. A Huffman decoding method for decoding codewords included in an encoded data transmitted via a stream, comprising:

processing codewords of the predefined codebook or the codebook extracted from the stream to derive at least an auxiliary lookup table, and storing each derived auxiliary lookup table in a storage device; and searching a decoded value corresponding to a target codeword included in the encoded data according to at least the auxiliary lookup table stored in the storage device and the codebook.

2. The method of claim 1, wherein the step of processing the codewords of the codebook comprises:
processing the codewords of the codebook to identify an upper bound and a lower bound for each of a plurality of codeword groups respectively corresponding to a plurality of different bit patterns, wherein each codeword in the same codeword group has a part of identical bit pattern; and
creating the auxiliary lookup table which records an upper bound and a lower bound of each of the codeword groups.

3. The method of claim 2, wherein searching the decoded value corresponding to the codeword comprises:
selecting a specific upper bound and a specific lower bound from the auxiliary lookup table according to the encoded data; and
referring to the specific upper bound and the specific lower bound to search one or more codewords of the codebook for the target codeword; and
outputting the decoded value which is recorded in the codebook and corresponds to the target codeword.

4. The method of claim 3, wherein the step of referring to the specific upper bound and the specific lower bound to search one or more codewords of the codebook for the target codeword comprises:
when only a specific codeword of the codebook is delimited by the specific upper bound and the specific lower bound, identifying the specific codeword of the codebook as the target codeword.

5. The method of claim 3, wherein the step of referring to the specific upper bound and the specific lower bound to search one or more codewords of the codebook for the target codeword comprises:
when a plurality of specific codewords of the codebook is delimited by the specific upper bound and the specific lower bound, performing a binary search upon the specific codewords of the codebook to find the target codeword.

6. The method of claim 3, wherein the step of processing the codewords of the codebook to identify the upper bound and the lower bound for each of the codeword groups respectively corresponding to the different bit patterns comprises:
counting a number of bit(s) successively following a sign bit of each codeword of the codebook and identical to the sign bit to derive a first count number, wherein each codeword in the same codeword group has the same first count number; and
identifying the upper bound and the lower bound for each of the codeword groups according to first count numbers respectively corresponding to the codewords of the codebook; and
the step of selecting the specific upper bound and the specific lower bound from the auxiliary lookup table comprises:
counting a number of bit(s) successively following a sign bit of the encoded data and identical to the sign bit to derive a second count number; and
selecting the specific upper bound and the specific lower bound corresponding to the second count number from the auxiliary lookup table.

7. The method of claim 2, wherein the step of processing the codewords of the codebook to identify the upper bound and the lower bound for each of the codeword groups comprises:
counting a number of bit(s) successively following a sign bit of each codeword of the codebook and identical to the sign bit to derive a first count number, wherein each codeword in the same codeword group has the same first count number; and
identifying the upper bound and the lower bound for each of the codeword groups according to first count numbers respectively corresponding to the codewords of the codebook.

8. The method of claim 1, wherein the step of processing the codewords of the codebook extracted from the stream comprises:
processing the codewords of the codebook to derive a first auxiliary lookup table, and processing the codewords of the codebook and the first auxiliary lookup table to derive a second auxiliary lookup table; and
the step of searching the decoded value corresponding to the target codeword comprises:
searching the decoded value corresponding to the target codeword included in the encoded data according to the first and second auxiliary lookup tables stored in the storage device and the codebook.

9. The method of claim 8, wherein the step of processing the codewords of the codebook to derive the first auxiliary lookup table comprises:
processing the codewords of the codebook to identify a plurality of first codeword groups respectively corresponding to a plurality of different codeword lengths, wherein each codeword in the same first codeword group has the same codeword length; and
creating the first auxiliary lookup table which records a sequence number of a first codeword group to which each of the codewords of the codebook corresponds, and records a starting codeword, an index value of the starting codeword in the codebook, and a codeword length to which each of the first codeword groups corresponds, wherein each codeword in the same first codeword group corresponds to the same sequence number.

10. The method of claim 9, wherein the step of processing the codewords of the codebook and the first auxiliary lookup table to derive the second auxiliary lookup table comprises:
processing the codewords of the codebook and referring to the first auxiliary lookup table for identifying an upper bound and a lower bound for each of a plurality of second codeword groups, wherein the upper bound and the lower bound of the second codeword group are an upper bound and a lower bound of sequence numbers of one or more first codeword groups which have at least one identical codeword with the second codeword group, the second codeword groups correspond to a plurality of different bit patterns, respectively, and each codeword in the same second codeword group has a part of identical bit pattern; and
creating the second auxiliary lookup table which records an upper bound and a lower bound corresponding to each of the second codeword groups.

11. The method of claim 10, wherein the step of searching the decoded value corresponding to the target codeword included in the encoded data according to the first auxiliary lookup table and the second auxiliary lookup table comprises:
selecting a specific upper bound and a specific lower bound from the second auxiliary lookup table according to the encoded data; and
referring to the specific upper bound and the specific lower bound to search one or more starting codewords of the first auxiliary lookup table for a target starting codeword; and outputting the decoded value which is recorded in the codebook and corresponds to the target codeword according to the target starting codeword.

12. The method of claim 11, wherein the step of outputting the decoded value which is recorded in the codebook and corresponds to the target codeword according to the target starting codeword comprises:

deriving an offset value according to a difference between the target starting codeword and the encoded data; and searching the codebook for the decoded value according to an index value of the target starting codeword and the offset value, and outputting the decoded value.

13. The method of claim 11, wherein the step of referring to the specific upper bound and the specific lower bound to search one or more starting codewords of the first auxiliary lookup table for the target starting codeword comprises:

when only a specific starting codeword of the first auxiliary lookup table is delimited by the specific upper bound and the specific lower bound, identifying the specific starting codeword of the first auxiliary lookup table as the target starting codeword.

14. The method of claim 11, wherein the step of referring to the specific upper bound and the specific lower bound to search one or more starting codewords of the first auxiliary lookup table for the target starting codeword comprises:

when a plurality of specific starting codewords of the first auxiliary lookup table is delimited by the specific upper bound and the specific lower bound, performing a binary search upon the specific starting codewords to find the target starting codeword.

15. The method of claim 11, wherein the step of identifying the upper bound and the lower bound corresponding to each of the second codeword groups respectively corresponding to the different bit patterns comprises:

counting a number of bit(s) successively following a sign bit of each codeword of the codebook and identical to the sign bit to derive a first count number, wherein each codeword in the same second codeword group has the same first count number; and identifying the upper bound and the lower bound corresponding to each of the second codeword groups according to sequence numbers of the first codeword groups and first count numbers corresponding to the codewords of the codebook; and the step of selecting the specific upper bound and the specific lower bound from the second auxiliary lookup table comprises:

counting a number of bit(s) successively following a sign bit of the encoded data and identical to the sign bit to derive a second count number; and selecting the specific upper bound and the specific lower bound corresponding to the second count number from the second auxiliary lookup table.

16. The method of claim 10, wherein the step of identifying the upper bound and the lower bound corresponding to each of the second codeword groups respectively corresponding to the different bit patterns comprises:

counting a number of bit(s) successively following a sign bit of each codeword of the codebook and identical to the sign bit to derive a first count number, wherein each codeword in the same second codeword group has the same first count number; and identifying the upper bound and the lower bound corresponding to each of the second codeword groups according to sequence numbers of the first codeword groups and first count numbers corresponding to the codewords of the codebook.

17. The method of claim 1, wherein the stream complies with a Moving Picture Experts Group (MPEG) Advanced Audio Coding (AAC) or a joint Photographic Experts Group (JPEG).

* * * * *